(12) United States Patent
Huppenthal et al.

(10) Patent No.: US 7,406,573 B2
(45) Date of Patent: Jul. 29, 2008

(54) RECONFIGURABLE PROCESSOR ELEMENT UTILIZING BOTH COARSE AND FINE GRAINED RECONFIGURABLE ELEMENTS

(75) Inventors: Jon M. Huppenthal, Colorado Springs, CO (US); Denis O. Kellam, Monument, CO (US)

(73) Assignee: SRC Computers, Inc., Colorado Springs, CO (US)

( * ) Notice: Subject to any disclaimer, the term of this patent is extended or adjusted under 35 U.S.C. 154(b) by 165 days.

(21) Appl. No.: 11/222,417

(22) Filed: Sep. 8, 2005

(65) Prior Publication Data
US 2006/0012395 A1  Jan. 19, 2006

Related U.S. Application Data

(60) Continuation-in-part of application No. 11/119,598, filed on May 2, 2005, which is a division of application No. 10/142,045, filed on May 9, 2002, now abandoned.

(51) Int. Cl.
*G06F 9/00* (2006.01)
(52) U.S. Cl. .................. 711/154; 326/41; 712/220; 712/226; 712/229; 710/36; 710/104
(58) Field of Classification Search .......... 712/1, 712/226, 220, 229; 326/1, 41; 711/154; 710/36, 104
See application file for complete search history.

(56) References Cited

U.S. PATENT DOCUMENTS

| | | | |
|---|---|---|---|
| 5,230,057 A | 7/1993 | Shido et al. | |
| 5,570,040 A | 10/1996 | Lytle et al. | |
| 5,613,033 A * | 3/1997 | Swamy et al. | 361/790 |
| 5,737,766 A | 4/1998 | Tan | |
| 5,802,290 A | 9/1998 | Casselman | |
| 5,892,962 A | 4/1999 | Cloutier | |
| 5,903,771 A | 5/1999 | Sgro et al. | |
| 6,023,755 A | 2/2000 | Casselman | |
| 6,052,773 A | 4/2000 | DeHon et al. | |
| 6,076,152 A | 6/2000 | Huppenthal et al. | |

(Continued)

FOREIGN PATENT DOCUMENTS

JP  59-206972  11/1984

(Continued)

OTHER PUBLICATIONS

Agarwal, A., et al., "The Raw Compiler Project", pp. 1-12, http://cag-www.lcs.mit.edu/raw, Proceedings of the Second SUIF Compiler Workshop, Aug. 21-23, 1997.

(Continued)

*Primary Examiner*—Stephen C. Elmore
*Assistant Examiner*—Daniel Kim
(74) *Attorney, Agent, or Firm*—William J. Kubida; Michael C. Martensen; Hogan & Hartson LLP

(57) ABSTRACT

A reconfigurable processor element incorporating both course and fine grained reconfigurable elements. In alternative implementations, the present invention may comprise a reconfigurable processor comprising both reconfigurable devices with fine grained logic elements and reconfigurable devices with course grained logic elements or a reconfigurable processor comprising both reconfigurable devices with fine grained elements and non-reconfigurable devices with course grained elements.

19 Claims, 8 Drawing Sheets

U.S. PATENT DOCUMENTS

| | | | |
|---|---|---|---|
| 6,192,439 | B1 | 2/2001 | Grunewald et al. |
| 6,226,776 | B1 | 5/2001 | Panchul et al. |
| 6,247,110 | B1 | 6/2001 | Huppenthal et al. |
| 6,289,440 | B1 | 9/2001 | Casselman |
| 6,334,207 | B1* | 12/2001 | Joly et al. ............... 716/17 |
| 6,339,819 | B1 | 1/2002 | Huppenthal et al. |
| 6,356,109 | B1 | 3/2002 | Furuta et al. |
| 6,414,391 | B1 | 7/2002 | Corisis et al. |
| 6,421,251 | B1* | 7/2002 | Lin ..................... 361/788 |
| 6,441,483 | B1 | 8/2002 | Akram |
| 6,496,971 | B1 | 12/2002 | Lesea et al. |
| 6,874,043 | B2 | 3/2005 | Treggiden |
| 6,877,044 | B2 | 4/2005 | Lo et al. |
| 2001/0015933 | A1 | 8/2001 | Reddy et al. |
| 2002/0186044 | A1* | 12/2002 | Agrawal et al. .......... 326/41 |
| 2003/0107399 | A1* | 6/2003 | Bailis et al. ............ 326/38 |

FOREIGN PATENT DOCUMENTS

| | | |
|---|---|---|
| JP | 63-086079 | 4/1988 |

OTHER PUBLICATIONS

Albaharna, Osama, et al., "On the viability of FPGA-based integrated coprocessors", © 1996 IEEE, Publ. No. 0-8186-7548-9/96, pp. 206-215.
Amerson, Rick, et al., "Teramac—Configurable Custom Computing", © 1995 EEE, Publ. No. 0-8186-7086-X/95, pp. 32-38.
Barthel, Dominique Aug. 25-26, 1997, "PVP a Parallel Video coProcessor", Hot Chips IX, pp. 203-210.
Bertin, Patrice, et al., "Programmable active memories: a performance assessment", © 1993 Massachusetts Institute of Technology, pp. 88-102.
Bittner, Ray, et al., "Computing kernels implemented with a wormhole RTR CCM", © 1997 IEEE, Publ. No. 0-8186-8159-4/97, pp. 98-105.
Buell, D., et al. "Splash 2: FPGAs in a Custom Computing Machine—Chapter 1—Custom Computing Machines: An Introduction", pp. 1-11, http://www.computer.org/espress/catalog/bp07413/spls-ch1.html (originally believed published In J. of Supercomputing, vol. IX, 1995, pp. 219-230.
Casselman, Steven, "Virtual Computing and The Virtual Computer", © 1993 IEEE, Publ. No. 0-8186-3890-7/93, pp. 43-48.
Chan, Pak, et al., "Architectural tradeoffs in field-programmable-device-based computing systems", © 1993 IEEE, Publ. No. 0-8186-3890-7/93, pp. 152-161.
Clark, David, et al., "Supporting FPGA microprocessors through retargetable software tools", © 1996 IEEE, Publ. No. 0-8186-7548-9/96, pp. 195-103.
Cuccaro, Steven, et al., "The CM-2X: a hybrid CM-2/Xilink prototype", © 1993 IEEE, Publ. No. 0-8186,3890-7/93, pp. 121-130.
Culbertson, W. Bruce, et al., "Exploring architectures for volume visualization on the teramac custom computer", © 1996 IEEE, Publ. No. 0-8186-7548-9/96, pp. 80-88.
Culbertson, W. Bruce, et al., "Defect tolerance on the Teramac custom computer", © 1997 IEEE, Publ. No. 0-8186-8159-4/97, pp. 116-123.
Dehon, Andre, "DPGA-Coupled microprocessors: commodity IC for the early 21$^{st}$ century", © 1994 IEEE, Publ. No. 0-8186-5490-2/94, pp. 31-39.
Dehon, A., et al., "MATRIX A Reconfigurable Computing Device with Configurable Instruction Distribution", Hot Chips IX, Aug. 25-26, 1997, Stanford, California, MIT Artificial Intelligence Laboratory.
Dhaussy, Philippe, et al., "Global control synthesis for an MIMD/FPGA machine", © 1994 IEEE, Publ. No. 0-8186-5490-2/94, pp. 72-81.
Elliott, Duncan, et al., "Computational Ram: a memory-SIMD hybrid and its application to DSP", © 1992 IEEE, Publ. No. 0-7803-0246-X/92, pp. 30.6.1-30.6.4.
Fortes, Jose, et al., "Systolic arrays, a survey of seven projects", © 1987 IEEE, Publ. No. 0018-9162/87/0700-0091, pp. 91-103.

Gokhale, M., et al., "Processing in Memory: The Terasys Massively Parallel PIM Array" © Apr. 1995, IEEE, pp. 23-31.
Gunther, Bernard, et al., "Assessing Document Relevance with Run-Time Reconfigurable Machines", © 1996 IEEE, Publ. No. 0-8186-7548-9/96, pp. 10-17.
Hagiwara, Hiroshi, et al., "A dynamically microprogrammable computer with low-level parallelism", © 1980 IEEE, Publ. No. 0018-9340/80/07000-0577, pp. 577-594.
Hartenstein, R. W., et al. "A General Approach in System Design Integrating Reconfigurable Accelerators," http://xputers.informatik.uni-kl.de/papers/paper026-1.html, IEEE 1996 Conference, Austin, TX, Oct. 9-11, 1996.
Hartenstein, Reiner, et al., "A reconfigurable data-driven ALU for Xputers", © 1994 IEEE, Publ. No. 0-8186-5490-2/94, pp. 139-146.
Hauser, John, et al.; "GARP: a MIPS processor with a reconfigurable co-processor", © 1997 IEEE, Publ. No. 0-08186-8159-4/97, pp. 12-21.
Hayes, John, et al., "A microprocessor-based hypercube, supercomputer", © 1986 IEEE, Publ. No. 0272-1732/86/1000-0006, pp. 6-17.
Herpel, H.-J., et al., "A Reconfigurable Computer for Embedded Control Applications", © 1993 IEEE, Publ. No. 0-8186-3890-7/93, pp. 111-120.
Hogl, H., et al., "Enable++: A second generation FPGA processor", © 1995 IEEE, Publ. No. 0-8186-7086-X/95, pp. 45-53.
King, William, et al., "Using MORRPH in an Industrial machine vision system". © 1996 IEEE, Publ. No. 08186-7548-9/96, pp. 18-26.
Manohar, Swaminathan, et al., "A pragmatic approach to systolic design", © 1988 IEEE, Publ. No. CH2603-9/88/0000/0463, pp. 463-472.
Mauduit, Nicolas, et al., "Lneuro 1.0: a piece of hardware LEGO for building neural network systems," © 1992 IEEE, Publ. No. 1045-9227/92, pp. 414-422.
Mirsky, Ethan A., "Coarse-Grain Reconfigurable Computing", Massachusetts Institute of Technology, Jun. 1996.
Mirsky, Ethan, et al., "MATRIX: A Reconfigurable Computing Architecture with Configurable Instruction Distribution and Deployable Resources", © 1996 IEEE, Publ. No. 0-8186-7548-9/96, pp. 157-166.
Morley, Robert E., Jr., et al., "A Massively Parallel Systolic Array Processor System", © 1988 IEEE, Publ. No. CH2603-9/88/0000/0217, pp. 217-225.
Patterson, David, et al., "A case for intelligent DRAM: IRAM", Hot Chips VIII, Aug. 19-20, 1996, pp. 75-94.
Peterson, Janes, et al., "Scheduling and partitioning ANSI-C programs onto multi-FPGA CCM architectures", © 1996 IEEE, Publ. No. 0-8186-7548-9/96, pp. 178-187.
Schmit, Herman, "Incremental reconfiguration for pipelined applications," © 1997 IEEE, Publ. No. 0-8186-8159-4/97, pp. 47-55.
Sitkoff, Nathan, et al., "Implementing a Genetic Algorithm on a Parallel Custom Computing Machine", Publ. No. 0-8186-7086-X/95, pp. 180-187.
Stone, Harold, "A logic-in-memory computer", © 1970 IEEE, IEEE Transactions on Computers, pp. 73-78, Jan. 1990.
Tangen, Uwe, et al., "A parallel hardware evolvable computer POLYP extended abstract", © 1997 IEEE, Publ. No. 0-8186-8159/4/97, pp. 238-239.
Thornburg, Mike, et al., "Transformable Computers", © 1994 IEEE, Publ. No. 0-8186-5602-6/94, pp. 674-679.
Tomita, Shinji, et al., "A computer low-level parallelism QA-2", © 1986 IEEE, Publ. No. 0-0384-7495-86/0000/0280, pp. 280-289.
Trimberger, Steve, et al., "A time-multiplexed FPGA", © 1997 IEEE, Publ. No. 0-8186-8159-4/97, pp. 22-28.
Ueda, Hirotada, et al., "A multiprocessor system utilizing enhanced DSP's for image processing", © 1988 IEEE, Publ. No. CH2603-9/88/0000/0611, pp. 611-620.
Villasenor, John, et al., "Configurable computing", © 1997 Scientific American, Jun. 1997.
Wang, Quiang, et al., "Automated field-programmable compute accelerator design using partial evaluation", © 1997 IEEE, Publ. No. 0-8186-8159-4/97, pp. 145-154.

W.H. Mangione-Smith and B.L. Hutchings. Configurable computing: The Road Ahead. In Proceedings of the Reconfigurable Architectures Workshop (RAW'97), pp. 81-96, 1997.

Wirthlin, Michael, et al., "The Nano processor: a low resource reconfigurable processor", © 1994 IEEE, Publ. No. 0-8186-5490-2/94, pp. 23-30.

Wirthlin, Michael, et al., "A dynamic instruction set computer", © 1995 IEEE, Publ. No. 0-8186-7086-X/95, pp. 99-107.

Wittig, Ralph, et al., "One Chip: An FPGA processor with reconfigurable logic", © 1996 IEEE, Publ. No. 0-8186-7548-9/96, pp. 126-135.

Yamauchi, Tsukasa, et al., "SOP: A reconfigurable massively parallel system and its control-data flow based compiling method", © 1996 IEEE, Publ. No. 0-8186-7548-9/96, pp. 148-156.

"Information Brief", PCI Bus Technology, © IBM Personal Computer Company, 1997, pp. 1-3.

Yun, Hyun-Kyu and Silverman, H. F.; "A distributed memory MIMD multi-computer with reconfigurable custom computing capabilities", Brown University, Dec. 10-13, 1997, pp. 7-13.

Hoover, Chris and Hart, David; "San Diego Supercomputer Center, Timelogic and Sun Validate Ultra-Fast Hidden Markov Model Analysis-One DeCypher-accelerated Sun Fire 6800 beats 2,600 CPUs running Linux-", San Diego Supercomputer Center, http://www.sdsc.edu/Press/02/050802_markovmodel.html, May 8, 2002, pp. 1-3.

Caliga, David and Barker, David Peter, "Delivering Acceleration: The Potential for Increased HPC Application Performance Using Reconfigurable Logic", SRC Computers, Inc., Nov. 2001, pp. 20.

Hammes, J.P., Rinker, R. E., McClure, D. M., Böhm, A. P. W., Najjar, W. A., "The SA-C Compiler Dataflow Description", Colorado State University, Jun. 21, 2001, pp. 1-25.

Callahan, Timothy J. and Wawrzynek, John, "Adapting Software Pipelining for Reconfigurable Computing", University of California at Berkeley, Nov. 17-19, 2000, pp. 8.

Ratha, Nalini K., Jain, Anil K. and Rover, Diane T., "An FPGA-based Point Pattern Matching Processor with Application to Fingerprint Matching", Michigan State University, Department of Computer Science, pp. 8.

Dehon, André, "Comparing Computing Machines", University of California at Berkeley, Proceedings of SPIE vol. 3526, Nov. 2-3, 1998, pp. 11.

Vemuri, Ranga R. and Harr, Randolph E., "Configurable Computing: Technology and Applications", University of Cincinnati and Synopsys Inc., IEEE, Apr. 2000, pp. 39-40.

Dehon, André, "The Density Advantage of Configurable Computing", California Institute of Technology, IEEE, Apr. 2000. pp. 41-49.

Haynes, Simon D., Stone, John, Cheung, Peter Y.K. and Luk, Wayne, "Video Image Processing with the Sonic Architecture", Sony Broadcast & Professional Europe, Imperial College, University of London, IEEE, Apr. 2000, pp. 50-57.

Platzner, Marco, "Reconfigurable Accelerators for Combinatorial Problems", Swiss Federal Institute of Technology (ETH) Zurich, IEEE, Apr. 2000, pp. 58-60.

Callahan, Timothy J., Hauser, John R. and Wawrzynek, John, "The Garp Architecture and C Compiler", University of California, Berkeley, IEEE, Apr. 2000. pp. 62-69.

Goldstein, Seth Copen, Schmit, Herman, Budiu, Mihai, Cadambi, Srihari, Moe, Matt and Taylor, R. Reed, "PipeRench: A Reconfigurable Architecture and Compiler", Carnegie Mellon University, IEEE, Apr. 2000. pp. 70-76.

Muchnick, Steven S., "Advanced Compiler Design and Implementation", Morgan Kaufmann Publishers, pp. 217.

Hammes, Jeffrey P., Dissertation "Compiling SA-C To Reconfigurable Computing Systems", Colorado State University, Department of Computer Science, Summer 2000, pp. 179.

Automatic Target Recognition, Colorado State University & USAF, http://www.cs.colostate.edu/cameron/applications.html, pp. 1-3.

Chodowiec, Pawel, Khuon, PO, Gaj, Kris, Fast Implementations of Secret-Key Block Ciphers Using Mixed Inner- and Outer-Round Pipelining, George Mason University, Feb. 11-13, 2001, pp. 9.

* cited by examiner

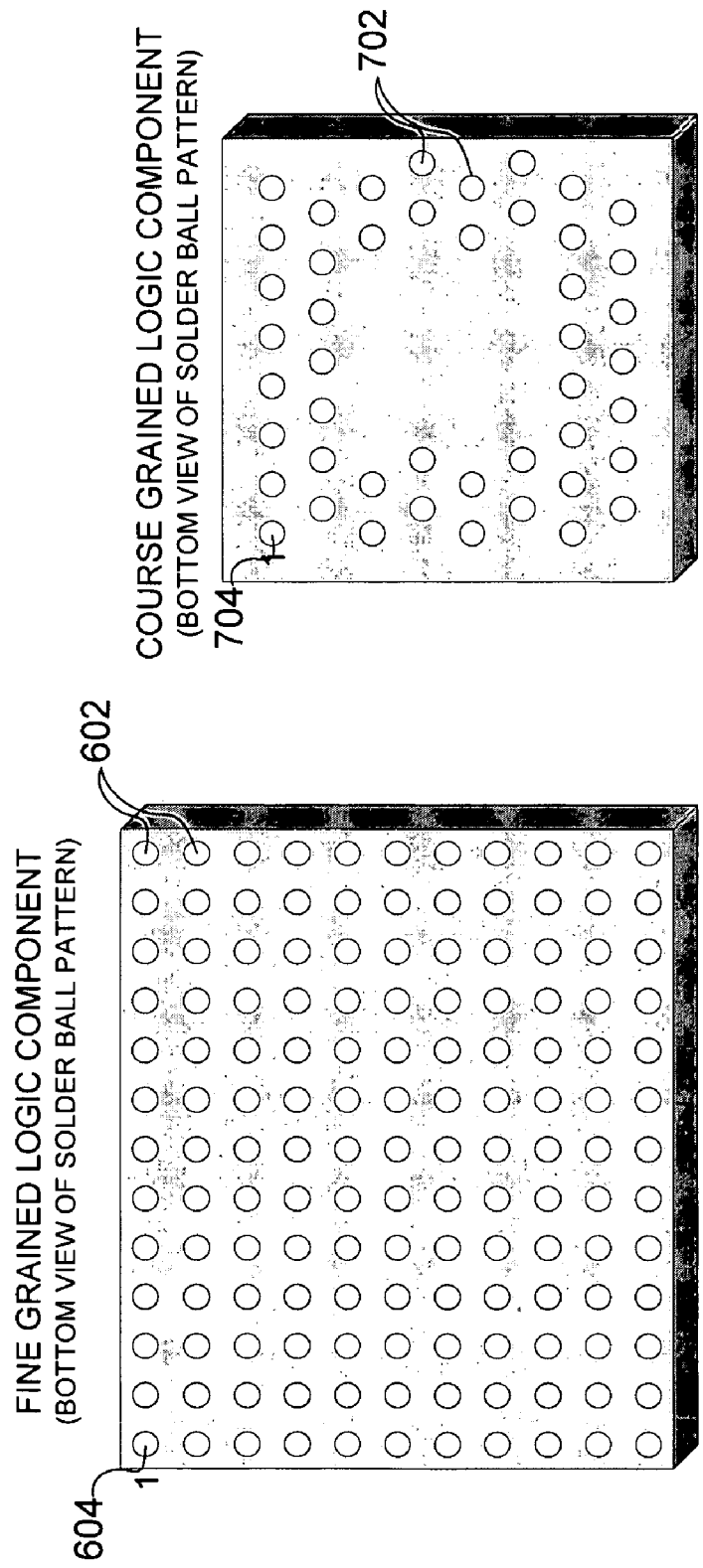

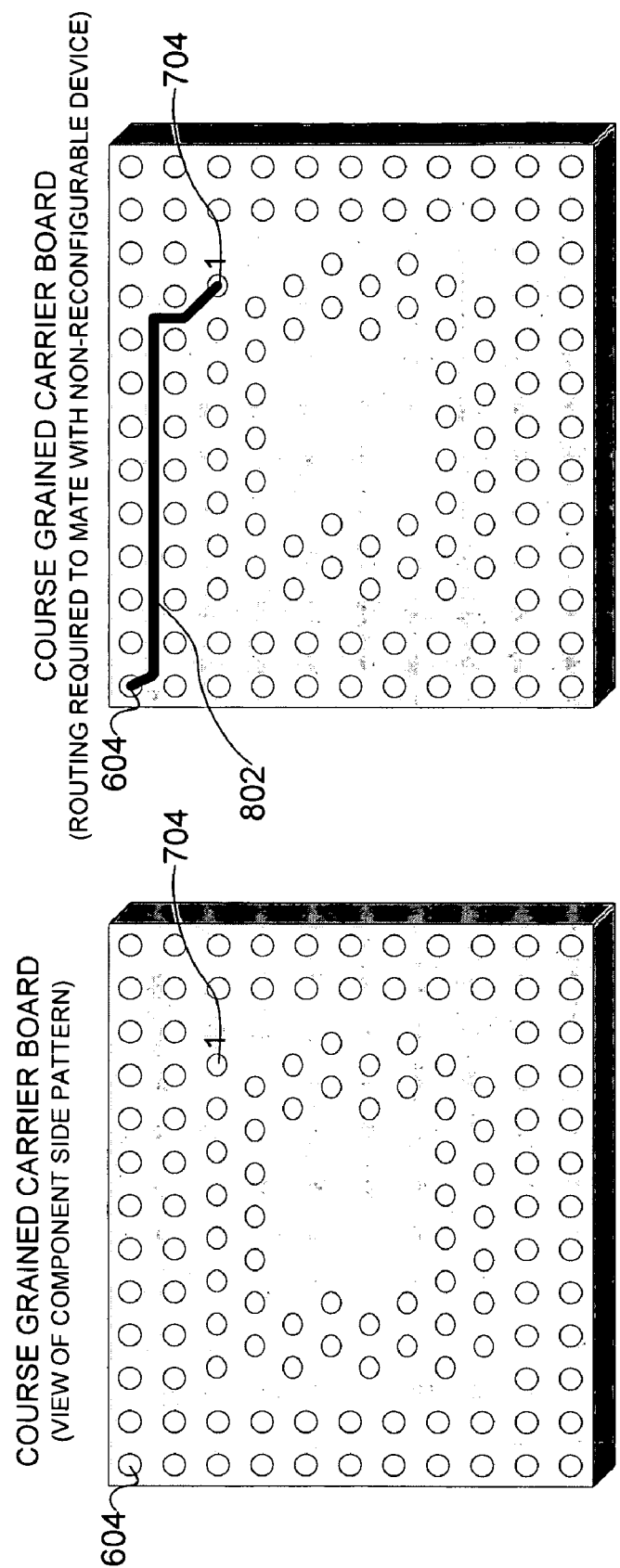

RECONFIGURABLE PROCESSOR ELEMENT UTILIZING BOTH COARSE AND FINE GRAINED RECONFIGURABLE ELEMENTS

CROSS REFERENCE TO RELATED PATENTS

The present invention is related to the subject matter of U.S. Pat. Nos. 6,076,152; 6,247,110 and 6,339,819 assigned to SRC Computers, Inc., Colorado Springs, Colo., assignee of the present invention. The present application claims priority from, and is a continuation-in-part application of, U.S. patent application Ser. No. 11/119,598 filed May 2, 2005 for: "Adaptive Processor Architecture Incorporating a Field Programmable Gate Array Control Element Having At Least One Embedded Microprocessor Core" which is a divisional application of U.S. patent application Ser. No. 10/142,045 filed May 9, 2002 now abandoned. The disclosures of the foregoing United States Patents and Patent Applications are specifically incorporated herein by this reference in their entirety.

BACKGROUND OF THE INVENTION

The present invention relates, in general, to the field of adaptive or reconfigurable processors. More particularly, the present invention relates to a multi-adaptive processor ("MAP™", a trademark of SRC Computers, Inc., assignee of the present invention) element architecture incorporating both course and fine grained reconfigurable elements.

Adaptive processors, sometimes referred to as reconfigurable processors, are processor elements that have the ability to alter their hardware functionality based on the program they are running. When compared to a standard microprocessor that can only sequentially execute pre-implemented logic, the adaptive processor has the ability to perform thousands of times more efficiently on a given program. When the next program is run, the logic is reconfigured via software, to again perform very efficiently. The integrated circuits used in these adaptive processors have historically fallen into two categories, namely the custom coprocessor application specific integrated circuits ("ASICs"), and the field programmable gate arrays ("FPGAs").

Many architectures have been proposed for custom integrated circuit chips containing both microprocessor features and programmable logic portions. These chips however, represent a poor implementation for high performance general purpose adaptive computing since they still have the very high non-recurring costs associated with a high performance custom ASIC, which in turn requires very large markets to make them economically viable. In addition, since both the normal microprocessor and the programmable logic are formed on the same die, the amount of reconfigurable logic will necessarily be much less than if they were each in provided as a discrete part. Since the performance of an adaptive processor is directly proportional to the number of gates it can utilize, this solution is severely limited and is best suited for specialized, limited use, adaptive processors.

An alternative to this approach is to use FPGAs to accomplish the adaptive computing function. However, these chips have historically been relatively small in terms of gate count. In addition, some portion of the gates of the FPGA also had to be used for control functions needed to communicate with the rest of the system. This led to their use primarily in board level products that were designed to target specific families of applications with limited input/output ("I/O") functionality. However, with recent advances in FPGA geometry, features and packaging, it has now become possible to implement new board level architectures that can be used to accomplish large scale high performance general purpose adaptive computing. One such computer is based on the unique SRC Computers, Inc. MAP™ multi-adaptive processor element architecture disclosed herein.

In the past, reconfigurable processors have been constructed using a variety of components containing fine grained logic elements such as those which are found in FPGAs. Fine grained logic elements are circuit elements that each perform very low level functions such as an AND or OR gate, or slightly larger functions such as counters. SRC Computers' MAP processor is one example of this type of reconfigurable processor. These fine grained devices allow for very versatile and relatively easy implementations of any desired function.

Nevertheless, as computer software such as SRC Computers' Carte™ programming environment has become available allowing more effective utilization of this form of processor, certain shortcomings of implementing reconfigurable processors in this fashion have become apparent. That is, while virtually any function can be implemented with fine grain logic elements, it may require a very large number of these elements to create very complex functions such as, for example, a 64 bit multiplier for floating point format numbers. As a result, only small quantities of such complex functional units can be implemented in a reconfigurable processor even if the largest FPGAs are used. Further, since reconfigurable processors generally exhibit relatively low clock rates compared to those of microprocessors, (and rely upon the parallelism of many functional units to exceed the performance of standard microprocessors), the relatively low number of functional units can result in rather poor performance.

One of the methods used by SRC Computers to limit the impact of this is to utilize two identical FPGAs back-to-back on the MAP processor as disclosed in U.S. patent application Ser. No. 10/142,045. This technique enables a doubling of the number of logic elements resulting in a theoretical doubling in performance and can be accomplished based upon certain unique characteristics of FPGA packages and the use of two functionally identical FPGAs. An alternative technique would be to replace the reconfigurable FPGAs with some higher density device such as an ASIC. However, this would result in unacceptably limited functionality since ASICs are not reconfigurable devices and would only perform the specific function for which they were designed.

SUMMARY OF THE INVENTION

The limitation described above is due, in part, to the fact that FPGAs are built from fine grain logic elements. A partial solution to this problem would be to create a device that is similar to an FPGA in terms of its internal reconfigurable routing resources, but different from an FPGA in that it is made up of blocks of larger course grained functional units, such as those used in 64 bit floating point math. However, building a reconfigurable processor from these devices alone would still lack the versatility that one derives from using fine grained devices which would result in limited applicability. To create a true general purpose reconfigurable processor (such as SRC Computers' MAP), with improved performance, requires that a high performance fine grained device be combined with a high performance course grained device.

However, for this combination to be effective, the two parts must be interconnected with thousands of very high performance interconnects. U.S. patent application Ser. No. 10/142, 045 discloses, inter alia, two identical parts that are placed on opposite sides of a printed circuit board (PCB). This allows vias through the board to be used to accomplish the thousands of interconnects needed between the two chips. The reconfigurable nature of the FPGAs pins then allows pin assignments to be altered (or programmed) as needed to effectively create two mirror image pin assignments on otherwise identical parts which allows for them to be mounted back to back with like pins being interconnected. While this technique has many advantages, a differing solution is required if two non-identical parts are to be interconnected.

Also disclosed herein is a multi-adaptive processor element architecture incorporating an FPGA control element which may have at least one embedded processor core. The overall architecture has as its primary components three FPGAs, DRAM and dual-ported SRAM banks, with the heart of the design being the user FPGAs which are loaded with the logic required to perform the desired processing. Discrete FPGAs are used to allow the maximum amount of reconfigurable circuitry and, in a particular embodiment disclosed herein, the performance of the multi-adaptive processor element may be further enhanced by preferably using two such FPGAs to form a user array.

By using two chips, they can be advantageously placed on opposite sides of the printed circuit board opposing each other with the contacts of their ball grid array ("BGA") packages sharing a common via through the board. Since the I/O pins of these devices are programmable, the two user FPGAs of the user array can be set up as mirror-image functional pin configurations. This eliminates most of the chip-to-chip routing that would otherwise be required for their interconnection to the degree necessary to allow them to function as effectively one larger device. Further, in this manner the circuit board layer count and cost is also minimized.

This mounting technique also permits the effective use of the largest pin count packages available which will maximize the I/O capability of the user array. Interconnecting the user FPGAs in this fashion makes the electrical loading of these two chips appear as a single electrical termination on the transmission lines that are formed by the traces that connect to the chips. At high data rates, such as that required by a high performance processor, this greatly simplifies termination of these lines leading to improved signal quality and maximum data rates. In current technology, as many as 1500 pins per package can be used and this mounting technique permits the simultaneous implementation of high bandwidth chip-to-chip connectivity, high bandwidth connectivity from one user array directly into a second user array on a different multi-adaptive processor element and high bandwidth connections to multiple banks of discrete dual-ported SRAM.

The dual-ported SRAM banks are used to provide very fast bulk memory to support the user array. To maximize its volume, discrete SRAM chips may be arranged in multiple, independently connected banks. This provides much more capacity than could be achieved if the SRAM were only integrated directly into the FPGAs. Again, the high input/output ("I/O") counts achieved by the particular packaging employed and disclosed herein currently allows commodity FPGAs to be interconnected to six, 64 bit wide SRAM banks achieving a total memory bandwidth of 4.8 Gbytes/sec with currently available devices and technology.

In operation, the high volume DRAM is "read" using its fast sequential burst modes and the lower capacity SRAM banks are then randomly loaded allowing the user FPGAs to experience very high random access data rates from what appears to be a very large virtual SRAM. The reverse also happens when the user FPGAs are "writing" data to the SRAM banks. These overall control functions may be managed by an on-chip DMA engine that is implemented in the control FPGA.

Specifically disclosed herein is an adaptive processor element for a computer system comprising a first control FPGA; a system interface bus coupled to the control FPGA for coupling the processor element to the computer system; dynamic random access memory (DRAM) coupled to the control FPGA; dual-ported static random access memory (SRAM) having a first port thereof coupled to the control FPGA; and a user array comprising at least one second user FPGA coupled to a second port of the dual-ported SRAM. Various computer system implementations of the adaptive processor element of the present invention disclosed herein are also provided. In each of the possible system level implementations, it should be noted that, while a microprocessor may be used in conjunction with the adaptive processor element(s), it is also possible to construct computing systems using only adaptive processor elements and no separate microprocessors.

Further disclosed herein is an adaptive processor using a discrete control FPGA having embedded processors, a system interface, a peripheral interface, a connection to discrete DRAM and a connection to one port of discrete dual ported SRAM, as well as discrete FPGAs forming a user array, with connections between the FPGAs forming the user array and to a second port of the dual ported discrete SRAM as well as chain port connections to other adaptive processors. The adaptive processor may comprise multiple discrete FPGAs coaxially located on opposite sides of a circuit board to provide the largest possible user array and highest bandwidth, while minimizing chip to chip interconnect complexity and board layer count. Dual-ported SRAM may be used and connected to the control chip and user array in conjunction with DRAM connected to the control chip, to form high speed circular transfer buffers.

An adaptive processor as previously described may further comprise an embedded processor in the control FPGA to create a high speed serial I/O channel to allow the adaptive processor to directly connect to peripheral devices such as disk drives for the purpose of reducing the bandwidth needed on the system interface. It may further comprise logic implemented in the control FPGA to create a high speed serial I/O channel to allow the adaptive processor to directly connect to peripheral devices such as disk drives for the purpose of reducing the bandwidth needed on the system interface. A system interface allows interconnection of multiple adaptive processors without the need for a host microprocessor for each adaptive processor and an embedded microprocessor in the control chip can be used to decode commands arriving via the system interface.

Further, an adaptive processor as previously described comprises SRAM used as common memory and shared by all FPGAs in the user array and can use separate peripheral I/O and system interconnect ports for the purpose of improving system scalability and I/O bandwidth. DRAM may further be used to provide for large on board storage that is also accessible by all other processors in the system.

Particularly disclosed herein is a reconfigurable processor comprising both fine and course grained logic elements. In alternative implementations, the present invention may comprise a reconfigurable processor comprising both reconfigurable devices with fine grained logic elements and reconfigurable devices with course grained logic elements or a reconfigurable processor comprising both reconfigurable devices with fine grained elements and non-reconfigurable devices with course grained elements.

In more specific implementations, the foregoing reconfigurable processors may be utilized in applications wherein the course grained device serves the purpose of providing dedicated high level math functions such as floating point operations or dedicated high level I/O functions such as Ethernet or disk drive connectivity. The reconfigurable processors disclosed herein may be programmable using standard high level languages and may utilize data streaming for movement between the fine and course grained elements or between the reconfigurable processor and other elements of the system.

In accordance with another specific implementation of the present invention, a carrier board may be utilized to allow the mounting of two dissimilar devices in a back-to-back fashion in order to create a reconfigurable processor. In a more specific implementation disclosed herein, the dissimilar devices may be reconfigurable devices.

By using this processor in SRC Computer's IMPLICIT+ EXPLICIT™ Architecture with SRC's Carte™ programming environment, a single system can, for the first time, contain standard microprocessors and reconfigurable processors with both fine and course grained reconfigurabilty, all controlled by programs written in standard high level languages such as C or Fortran.

In addition to the course grained compute functionality described earlier, such course grained chips (some of which may be what is denominated a structured ASIC), may also be used to perform specific interface functions which again use too much fine grained logic, such as Ethernet protocol processing or disk drive protocol processing. In these cases the tight mechanical and electrical coupling between the course and fine grained components, in conjunction with SRC Computer's Intellectual Property dealing with data streaming and flow control in reconfigurable processors, results in greatly improved performance over more electrically distributed solutions while maintaining the benefits of reconfigurable processing.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 6 is a simplified bottom view illustration of a representative fine grained logic component showing a particular solder ball pattern with exemplary pin 1 thereof;

FIG. 7 is an additional, simplified bottom view illustration of a correspondingly representative course grained logic component showing a particular solder ball pattern with exemplary pin 1 thereof;

FIG. 8 is a further, simplified view of a course grained carrier board in accordance with the present invention showing the component side thereof wherein the desired location of the course grained pin 1 is in the uppermost left hand corner thereof;

FIG. 9 is a follow-on, simplified view of a course grained carrier board as illustrated in the preceding figure but wherein the less than desirable non-reconfigurable routing between pin 1 of the fine grained logic component of FIG. 6 and pin 1 of the course grained logic component of FIG. 7 is shown.

DESCRIPTION OF A REPRESENTATIVE EMBODIMENT

Figure 1A:
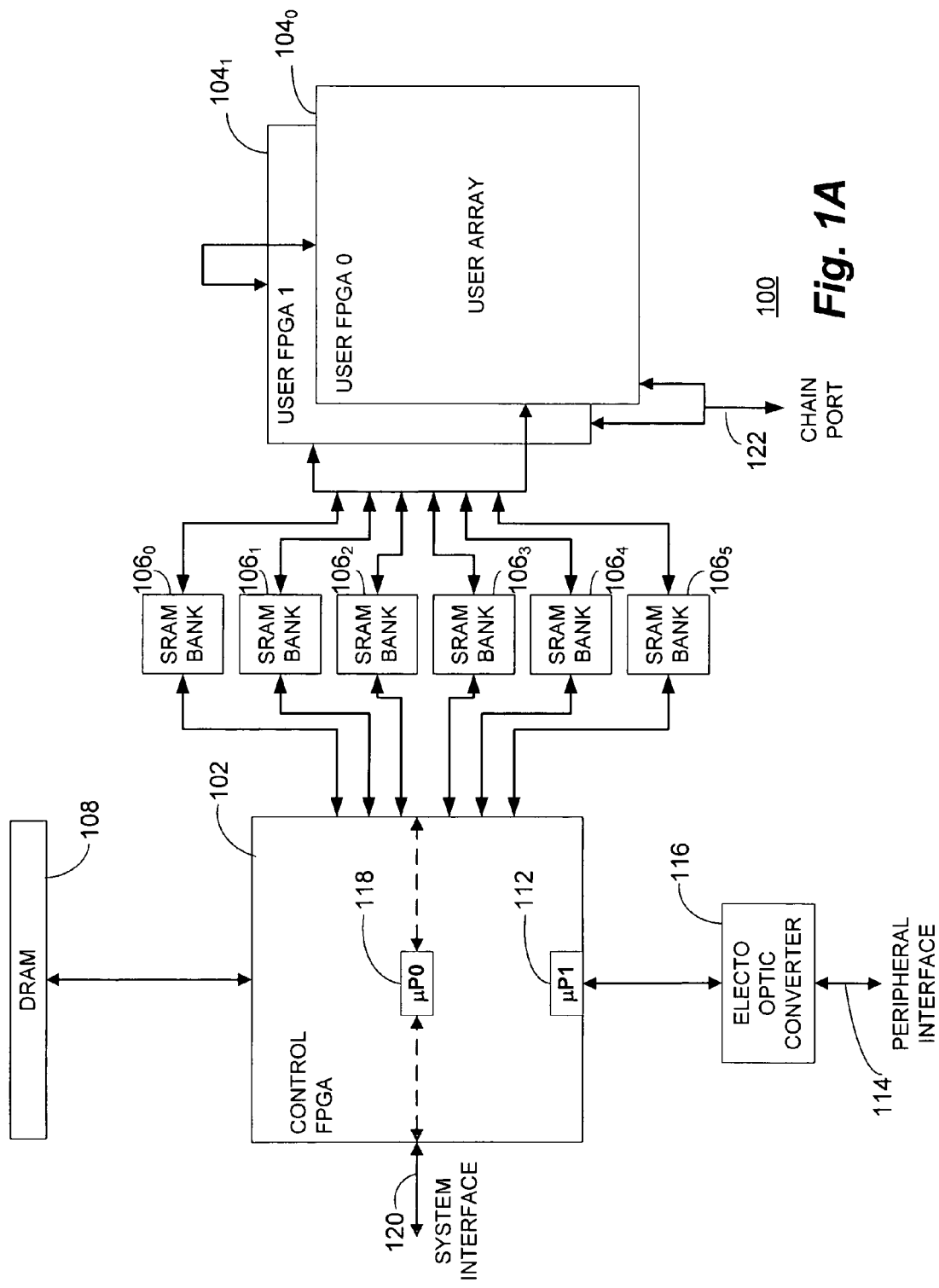
FIG. 1A is a functional block diagram of a particular, representative embodiment of a multi-adaptive processor element incorporating a field programmable gate array ("FPGAs") control element having embedded processor cores in conjunction with a pair of user FPGAs and six banks of dual-ported static random access memory ("SRAM")

With reference now to FIG. 1A, a functional block diagram of a particular, representative embodiment of a multi-adaptive processor element 100 is shown. The multi-adaptive processor element 100 comprises, in pertinent part, a discrete control FPGA 102 operating in conjunction with a pair of separate user FPGAs $104_0$ and $104_1$. The control FPGA 102 and user FPGAs $104_0$ and $104_1$ are coupled through a number of SRAM banks 106, here illustrated in this particular implementation, as dual-ported SRAM banks $106_0$ through $106_5$. An additional memory block comprising DRAM 108 is also associated with the control FPGA 102.

The control FPGA 102 includes a number of embedded microprocessor cores including μP1 112 which is coupled to a peripheral interface bus 114 by means of an electro optic converter 116 to provide the capability for additional physical length for the bus 114 to drive any connected peripheral devices (not shown). A second microprocessor core μP0 118 is utilized to manage the multi-adaptive processor element 100 system interface bus 120, which although illustrated for sake of simplicity as a single bi-directional bus, may actually comprise a pair of parallel unidirectional busses. As illustrated, a chain port 122 may also be provided to enable additional multi-adaptive processor elements 100 to communicate directly with the multi-adaptive processor element 100 shown.

The overall multi-adaptive processor element 100 architecture, as shown and previously described, has as its primary components three FPGAs 102 and $104_0$, $104_1$, the DRAM 108 and dual-ported SRAM banks 106. The heart of the design is the user FPGAs $104_0$, $104_1$ which are loaded with the logic required to perform the desired processing. Discrete FPGAs $104_0$, $104_1$ are used to allow the maximum amount of reconfigurable circuitry. The performance of this multi-adaptive processor element 100 may be further enhanced by using a maximum of two such FPGAs 104 to form a user array. By using two chips, they can be placed on opposite sides of the circuit board from each other as will be more fully described hereinafter.

The dual-ported SRAM banks 106 are used to provide very fast bulk memory to support the user array 104. To maximize its volume, discrete SRAM chips may be arranged in multiple, independently connected banks $106_0$ through $106_5$ as shown. This provides much more capacity than could be achieved if the SRAM were only integrated directly into the FPGAs 102 and/or 104. Again, the high input/output ("I/O") counts achieved by the particular packaging employed and disclosed herein currently allows commodity FPGAs to be interconnected to six, 64 bit wide SRAM banks $106_0$ through $106_5$ achieving a total memory bandwidth of 4.8 Gbytes/sec.

Typically the cost of high speed SRAM devices is relatively high and their density is relatively low. In order to compensate for this fact, dual-ported SRAM may be used with each SRAM chip having two separate ports for address and data. One port from each chip is connected to the two user array FPGAs $104_0$ and $104_1$ while the other is connected to a third FPGA that functions as a control FPGA 102. This control FPGA 102 also connects to a much larger high speed DRAM 108 memory dual in-line memory module ("DIMM"). This DRAM 108 DIMM can easily have 100 times the density of the SRAM banks 106 with similar bandwidth when used in certain burst modes. This allows the multi-adaptive processor element 100 to use the SRAM 106 as a circular buffer that is fed by the control FPGA 102 with data from the DRAM 108 as will be more fully described hereinafter.

The control FPGA 102 also performs several other functions. In a preferred embodiment, control FPGA 102 may be selected from the Virtex Pro family available from Xilinx, Inc. San Jose, Calif., which have embedded Power PC microprocessor cores. One of these cores (μP0 118) is used to decode control commands that are received via the system interface bus 120. This interface is a multi-gigabyte per second interface that allows multiple multi-adaptive processor elements 100 to be interconnected together. It also allows for standard microprocessor boards to be interconnected to multi-adaptive processor elements 100 via the use of SRC SNAP™ cards. ("SNAP" is a trademark of SRC Computers, Inc., assignee of the present invention; a representative implementation of such SNAP cards is disclosed in U.S. patent application Ser. No. 09/932,330 filed Aug. 17, 2001 for: "Switch/Network Adapter Port for Clustered Computers Employing a Chain of Multi-Adaptive Processors in a Dual In-Line Memory Module Format" assigned to SRC Computers, Inc., the disclosure of which is herein specifically incorporated in its entirety by this reference.) Packets received over this interface perform a variety of functions including local and peripheral direct memory access ("DMA") commands and user array 104 configuration instructions. These commands may be processed by one of the embedded microprocessor cores within the control FPGA 102 and/or by logic otherwise implemented in the FPGA 102.

To increase the effective bandwidth of the system interface bus 120, several high speed serial peripheral I/O ports may also be implemented. Each of these can be controlled by either another microprocessor core (e.g. μP1 112) or by discrete logic implemented in the control FPGA 102. These will allow the multi-adaptive processor element 100 to connect directly to hard disks, a storage area network of disks or other computer mass storage peripherals. In this fashion, only a small amount of the system interface bus 120 bandwidth is used to move data resulting in a very efficient system interconnect that will support scaling to high numbers of multi-adaptive processor elements 100. The DRAM 108 on board any multi-adaptive processor element 100 can also be accessed by another multi-adaptive processor element 100 via the system interface bus 120 to allow for sharing of data such as in a database search that is partitioned across several multi-adaptive processor elements 100.

Figure 1B:
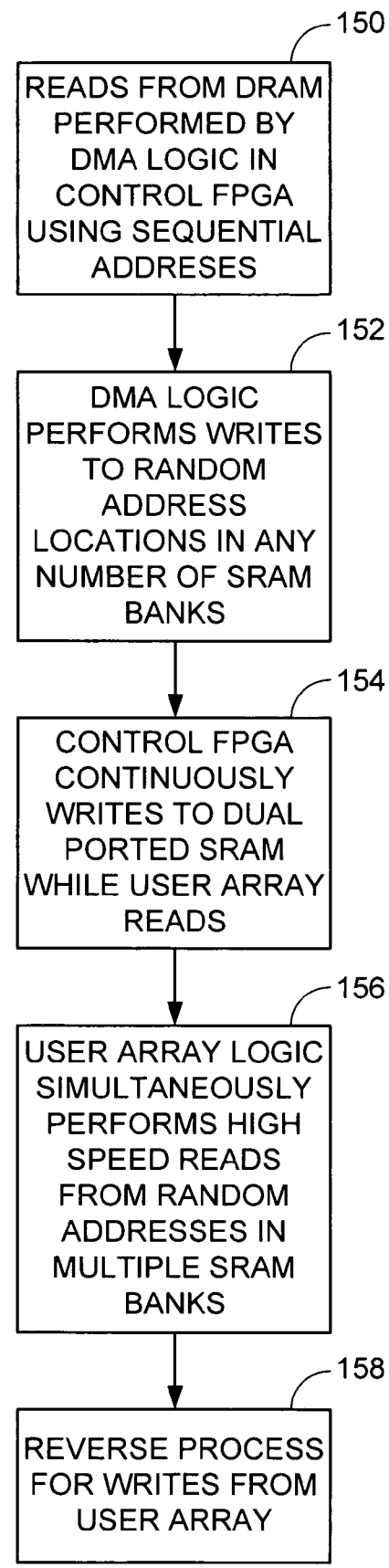
FIG. 1B is a simplified flowchart illustrative of the general sequence of "read" and "write" operations as between the dynamic random access memory ("DRAM") and SRAM portions of the representative embodiment of the preceding figure.

With reference additionally now to FIG. 1B, a simplified flowchart is shown illustrative of the general sequence of "read" and "write" operations as between the DRAM 108 and SRAM bank 106 portions of the representative embodiment of the preceding figure. At step 150, reads are performed by the DMA logic in the control FPGA 102 using sequential addresses to achieve the highest bandwidth possible from the DRAM 108. At step 152 the DMA logic then performs "writes" to random address locations in any number of the SRAM banks 106.

Thereafter, at step 154, the use of dual-ported SRAM allows the control FPGA 102 to continuously "write" into the SRAM banks 106 while the user FPGAs 104 continuously "reads" from them as well. At step 156, the logic in the user FPGAs 104 simultaneously performs high speed "reads" from the random addresses in the multiple SRAM banks 106. As indicated by step 158, the previously described process is reversed during "writes" from the user FPGAs 104 comprising the user array.

Briefly, the high volume DRAM 108 is "read" using its fast sequential burst modes and the lower capacity SRAM banks 106 are then randomly loaded allowing the user FPGAs 104 to experience very high random access data rates from what appears to be a very large virtual SRAM. The reverse also happens when the user FPGAs are "writing" data to the SRAM banks 106. These overall control functions may be managed by an on-chip DMA engine that is implemented in the control FPGA 102.

Figure 2:
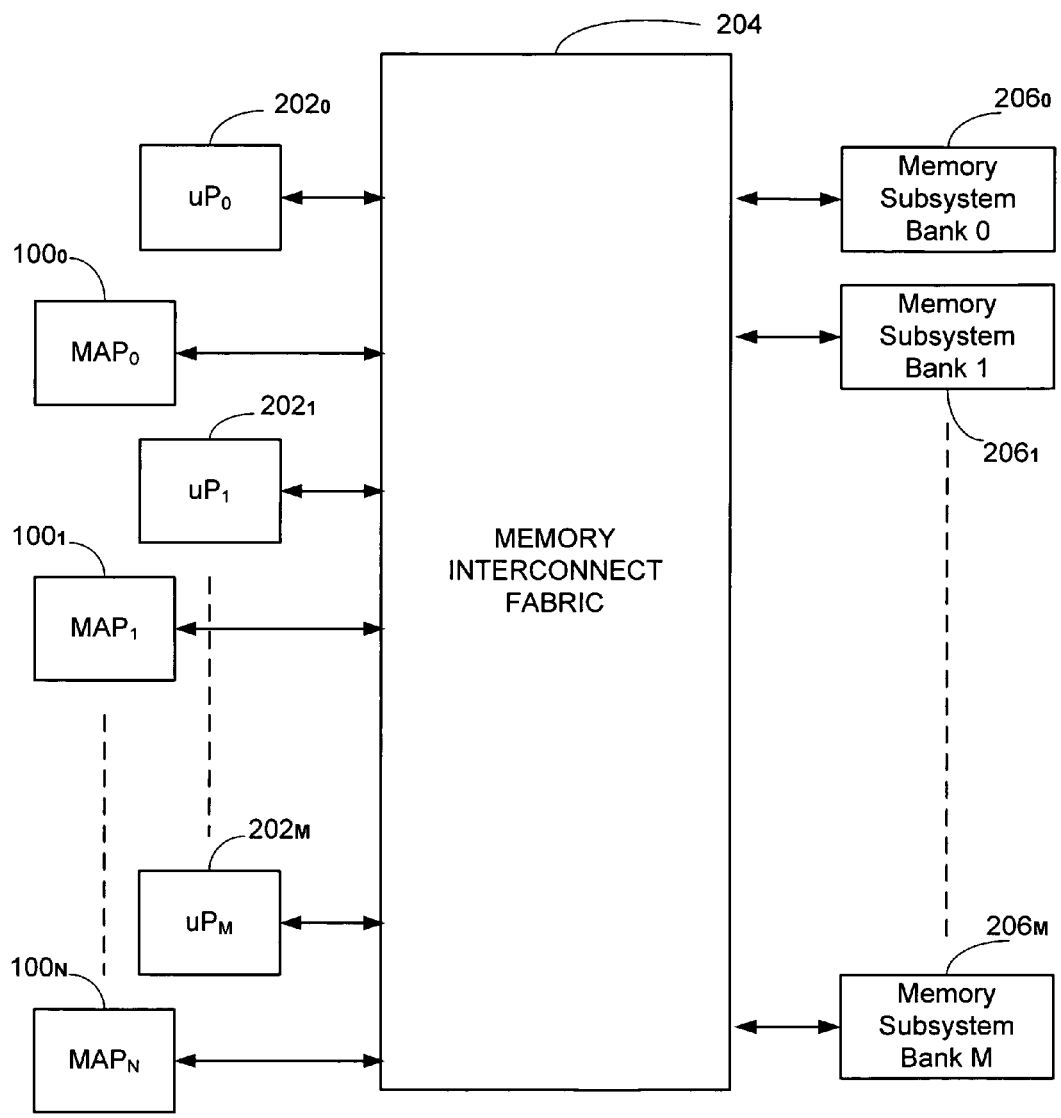
FIG. 2 is a system level block diagram of an exemplary implementation of a computer system utilizing one or more of the multi-adaptive processor elements of FIG. 1A in conjunction with one or more microprocessors and memory subsystem banks as functionally coupled by means of a memory interconnect fabric.

With reference additionally now to FIG. 2, a system level block diagram of an exemplary implementation of a computer system 200 is shown. This particular embodiment of a computer system 200 may utilize one or more of the multi-adaptive processor elements $100_0$ through $100_N$ of FIG. 1A in conjunction with one or more microprocessors $202_0$ through $202_M$ and memory subsystem banks $206_0$ through $206_M$ as functionally coupled by means of a memory interconnect fabric 204.

Figure 3:
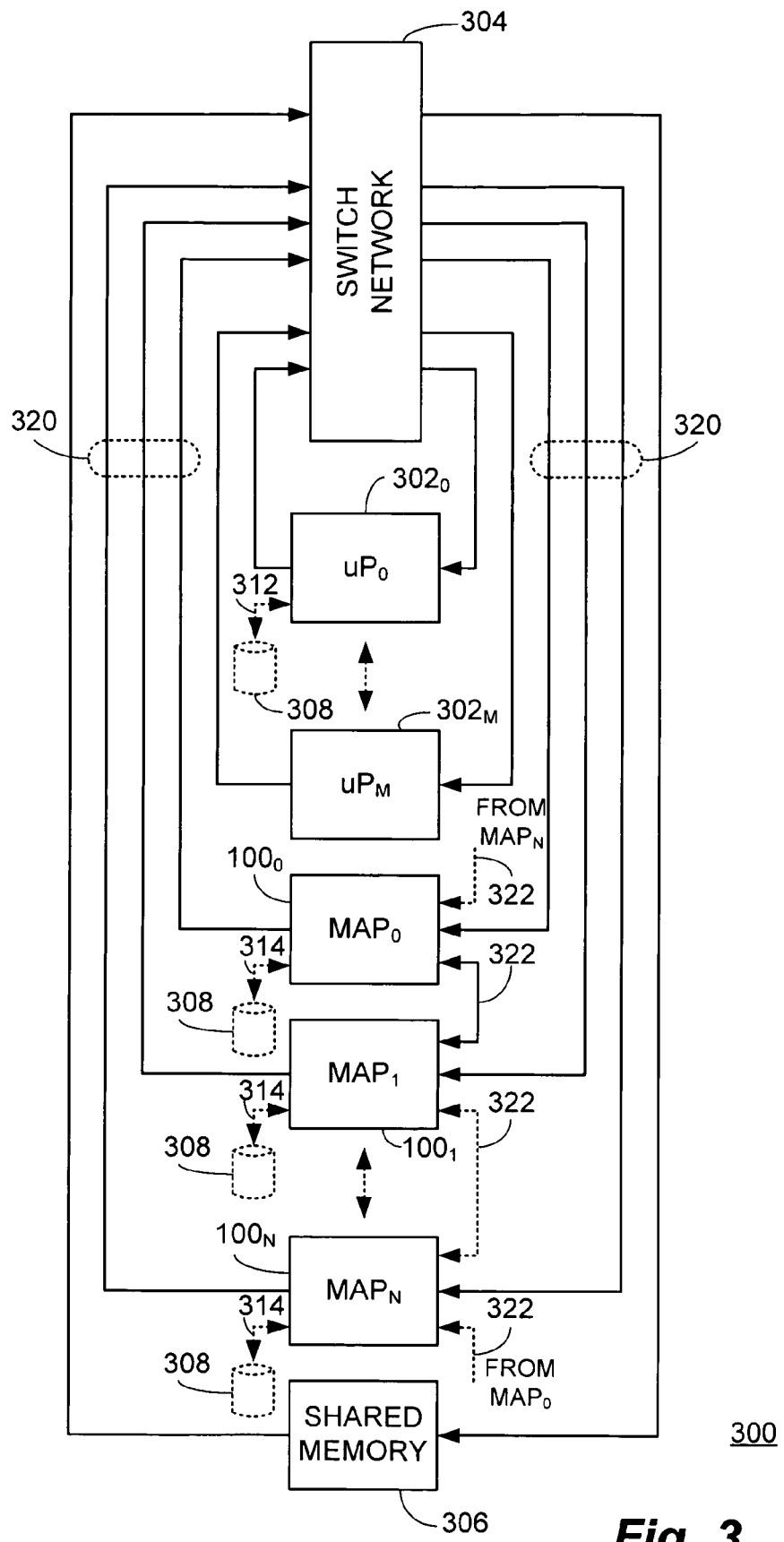
FIG. 3 is a further system level block diagram of another exemplary implementation of a computer system utilizing one or more of the multi-adaptive processor elements of FIG. 1A in conjunction with one or more microprocessors functionally coupled to a shared memory resource by means of a switch network.

With reference additionally now to FIG. 3, a further system level block diagram of another exemplary implementation of a computer system 300 is shown. This particular embodiment of a computer system 300 may also utilize one or more of the multi-adaptive processor elements $100_0$ through $100_N$ of FIG. 1A in conjunction with one or more microprocessors $302_0$ through $302_M$ functionally coupled to a switch network 304 by means of a system interface bus 320 and, in turn, to a shared memory resource 306. Through the provision of individual peripheral interface busses 314, each of the multi-adaptive processor elements $100_0$ through $100_N$ may directly access attached storage resources 308 as may one or more of the microprocessors $302_0$ through $302_M$ through a peripheral bus 312. A number of chain ports 322 may provide direct coupling between individual multi-adaptive processor elements $100_0$ through $100_N$.

Figure 4:
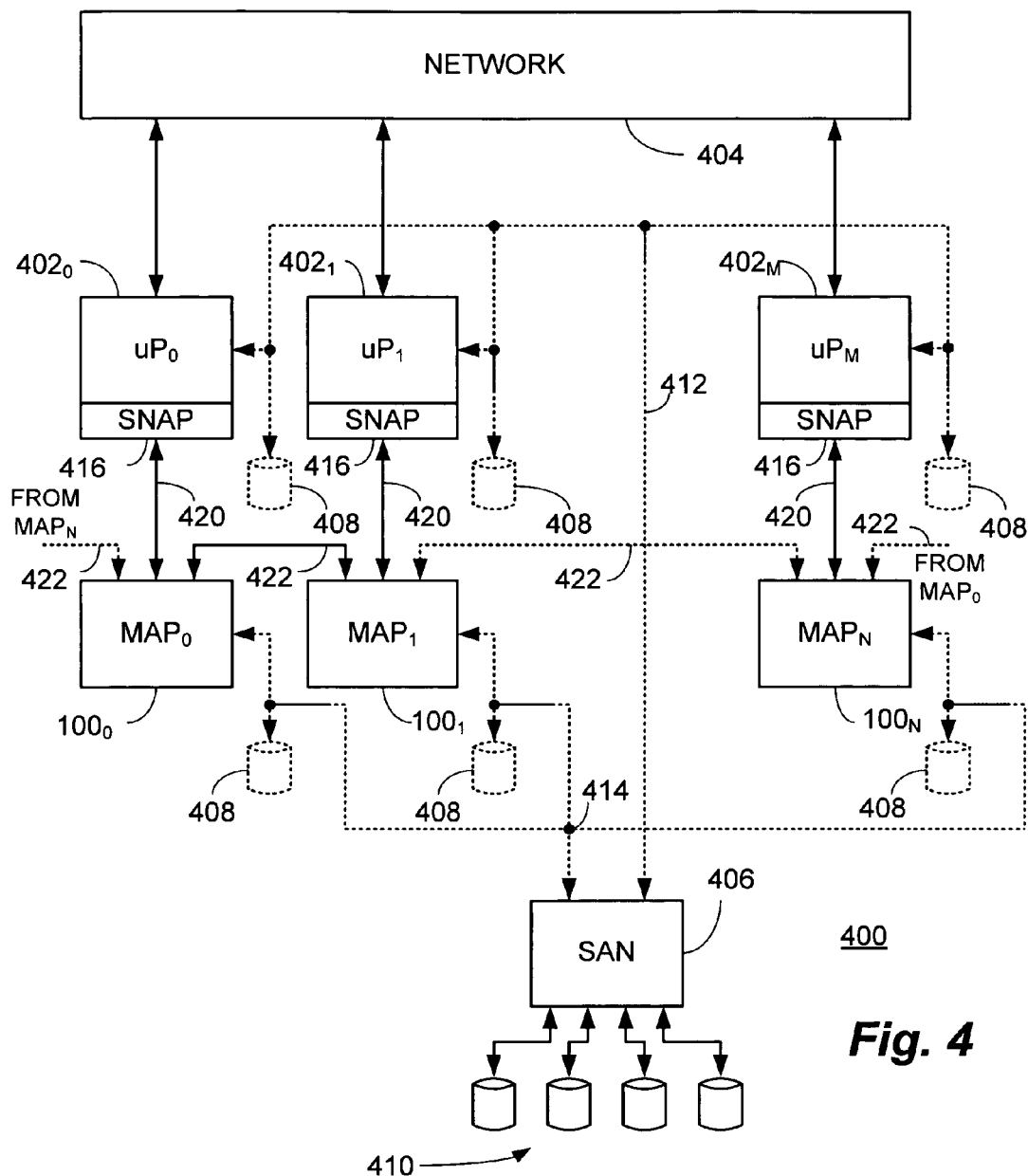
FIG. 4 is an additional system level block diagram of yet another exemplary implementation of a computer system utilizing one or more of the multi-adaptive processor elements of FIG. 1A in conjunction with one or more microprocessors and having shared peripheral storage though a storage area network ("SAN")

With reference additionally now to FIG. 4, an additional system level block diagram of yet another exemplary implementation of a computer system 400 is shown. This particular implementation of a computer system 400 may additionally utilize one or more of the multi-adaptive processor elements $100_0$ through $100_N$ of FIG. 1A in conjunction with one or more microprocessors $402_0$ through $402_M$ coupled to the multi-adaptive processing elements 100 through respective system interface busses 420 and SNAP cards 416 as previously described. The multi-adaptive processor elements $100_0$ through $100_N$ may be directly coupled to each other by means of chain ports 422 as shown.

In this implementation, the microprocessors $402_0$ through $402_M$ are coupled by means of a network 404 and the multi-adaptive processor elements $100_0$ through $100_N$ and microprocessors $402_0$ through $402_M$ may each have a directly coupled storage element 408 coupled to a peripheral interface 414 or 412 respectively. Alternatively, the multi-adaptive processor elements $100_0$ through $100_N$ and microprocessors $402_0$ through $402_M$ may each be coupled to a storage area network ("SAN") to access shared storage 410.

Figure 5:
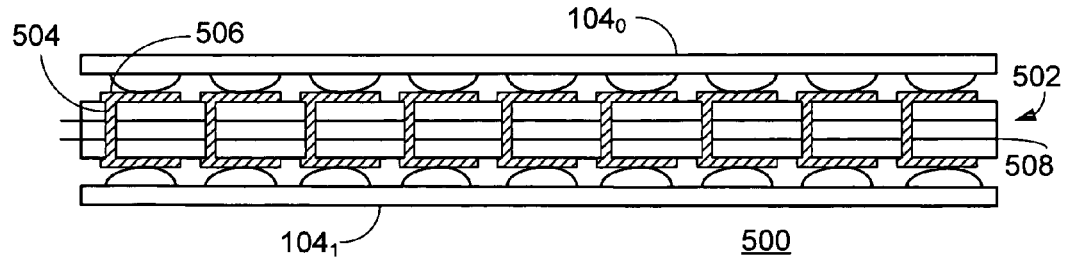
FIG. 5 is a partial cross-sectional view of a particular printed circuit board implementation of a technique for the mounting and interconnection of a pair of user FPGAs of possible use in the representative multi-adaptive processor element of FIG. 1A.

With reference additionally now to FIG. 5, a partial cross-sectional view of a particular printed circuit board 500 is shown. In accordance with the mounting configuration shown, the two user FPGAs $104_0$ and $104_1$ (FIG. 1A) may be mounted and interconnected as shown, particularly when furnished in a ball grid array configuration. The contacts of the user FPGAs $104_0$ and $104_1$ are soldered to opposing sides of a multi-layer printed circuit board 502 which includes a number of through board vias 504 with associated, offset contact pads 506. A number of electrical interconnects 508 provide electrical connections to the vias 504 and contact pads 506 and, in turn, to both of the user FPGAs $104_0$ and $104_1$.

Discrete FPGAs 104 are used for the user array to allow the maximum amount of reconfigurable circuitry. The performance of this multi-adaptive element 100 (FIG. 1A) is further enhanced by using a preferred two of such FPGAs 104 to form the user array. By using two chips, they can be placed on opposite sides of the printed circuit board 502 opposing each other with the contacts of their BGA packages sharing a common via 504 through the board. Since the I/O pins of these devices are programmable, the two user FPGAs $104_0$ and $104_1$ can be set up as mirror-image functional pin configurations. This eliminates most of the chip-to-chip routing that would otherwise be required for their interconnection to the degree necessary to allow them to function as effectively one larger device. Further, in this manner circuit board 502 layer count and cost is also minimized. This mounting technique also permits the effective use of the largest pin count packages available which will maximize the I/O capability of the user array. Interconnecting the user FPGAs 104 of the user array in this fashion makes the electrical loading of these two chips appear as a single electrical termination on the transmission lines that are formed by the traces that connect to the chips. At high data rates, such as that required by a high performance processor, this greatly simplifies termination of these lines leading to improved signal quality and maximum data rates. In current technology, as many as 1500 pins per package can be used and this mounting technique permits the simultaneous implementation of high bandwidth chip-to-chip connectivity, high bandwidth connectivity from one user array directly into a second user array on a different multi-adaptive processor element 100 and high bandwidth connections to multiple banks of discrete dual-ported SRAM 106.

With reference additionally now to FIG. 6, a simplified bottom view illustration of a representative fine grained logic component 600 is shown. The fine grained logic component 600 is illustrated as having a particular solder ball 602 pattern. An exemplary pin 1 of the plurality of solder balls 602 has been designated number 604.

With reference additionally now to FIG. 7, an additional, simplified bottom view illustration of a correspondingly representative course grained logic component 700 is shown. The course grained logic component 700 is illustrated as having a differing solder ball 702 pattern. As before, an exemplary pin 1 of the plurality of solder balls 702 has been designated number 704.

In many cases, the fine grained logic component 600 and course grained logic component 700 will not be supplied by the same manufacturer, and will most likely not have the same pin count, package style or power supply voltage requirements as has been illustrated in the preceding FIGS. 6 and 7.

Custom packaging would be very costly and not practical for very high performance parts such as these due to package qualification costs and other factors.

With reference additionally now to FIG. 8, a further, simplified view of a course grained carrier board 800 in accordance with the present invention is shown. In this particular illustration, the component side of the course grained carrier board 800 is depicted. The desired location of the course grained logic component 700 pin 1 (designated 704) is indicated while the location of pin 1 (designated as 604; c.f. FIG. 6) of the fine grained logic component 600 remains in the uppermost left hand corner thereof. In accordance with the present invention, either the fine grained logic component 600 or the course grained logic component 700 may be mounted to a small substrate, or carrier board, constructed with, for example, a ball grid array pattern that is designed to match with the other component.

With reference additionally now to FIG. 9, a follow-on, simplified view of a course grained carrier board 800 is shown wherein a less than desirable non-reconfigurable routing 802 is indicated between representative pin 1 (number 604) of the fine grained logic component 600 of FIG. 6 and pin 1 (number 704) of the course grained logic component 700 of FIG. 7. In this instance, in order to achieve the correct alignment of the numerous pins of the fine grained logic component 600 and maintain acceptable signal integrity at the desired high signal rates requires that many long traces of microstrip or stipline be employed. This amount of routing would result in a carrier board that would require dozens of layers and be between 0.125" and 0.25" thick. In addition, the long vias that are required to get from the ball side of this carrier to the chip side would result in significantly degraded electrical performance.

Figure 10:
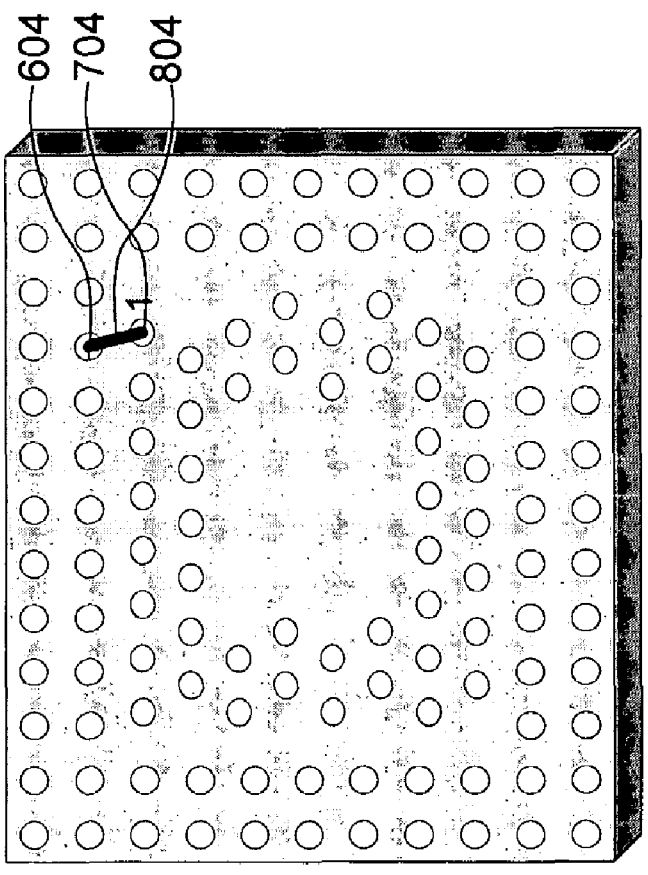
FIG. 10 is a final, simplified view of a course grained carrier board as illustrated in FIG. 8 showing a possible routing between a reconfigured location of pin 1 of the fine grained logic component of FIG. 6 and pin 1 of the course grained logic component of FIG. 7.

With reference additionally now to FIG. 10, a final, simplified view of a course grained carrier board 1000 is shown similar to that illustrated in FIG. 8. Here, a possible routing 804 between a reconfigured location of pin 1 (designated 604) of the fine grained logic component 600 of FIG. 6 and pin 1 (designated 704) of the course grained logic component 700 of FIG. 7 is shown. In this instance, the reconfigurable nature of the I/O cells of both the fine grained logic component 600 and course grained logic component 700 allows for a much thinner carrier board 100 with minimal routing requirements. In other words, the reconfigurable nature of the components' I/O cells allows for a much more desirable final pin matching as is illustrated in the single pin connection example shown. In this manner, it is possible to create a high performance reconfigurable processor that has both traditional fine grained and non-traditional course grained logic elements.

With respect to the exemplary implementations of the computer systems 200 (FIG. 2), 300 (FIG. 3) and 400 (FIG. 4), it should be noted that, while the microprocessors 202, 302 and 402 respectively may be furnished as commercially available integrated circuit microprocessors, other implementations for such a processor or processing element may also be used, for example, the multi-adaptive processor element 100 disclosed herein.

While there have been described above the principles of the present invention in conjunction with specific computer system architectures and multi-adaptive processor element configurations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A circuit board having opposite first and second sides thereof, said circuit board comprising:
    first and second pluralities of bonding pads affixed on said opposite first and second sides of said circuit board respectively;
    a first integrated circuit device having programmable pins bonded to at least a subset of said first plurality of bonding pads;
    a second integrated circuit device having programmable pins bonded to at least a subset of said second plurality of bonding pads;
    a plurality of vias formed intermediate said opposite first and second sides of said circuit board for electrically interconnecting opposing ones of said subset of said first and second pluralities of bonding pads; and
    a plurality of conductive traces for electrically interconnecting each of a subset of said programmable pins of said first integrated circuit device to unique programmable pins of a subset of said second integrated circuit device wherein said subset of programmable pins of said first integrated circuit and said subset of second integrated circuit are reconfigured to optimize bandwidth of said plurality of conductive traces interconnecting said first integrated circuit to said second integrated circuit.

2. The circuit board of claim 1 wherein said first and second integrated circuit devices comprise a user array for an adaptive processor element.

3. A reconfigurable processor element comprising:
    at least one fine grained logic element wherein said at least one fine grained logic element comprises a plurality of reconfigurable fine grained logic elements including fine grained logic element programmable pins
    at least one coarse grained logic element wherein said at least one coarse grained logic element comprises a plurality of reconfigurable coarse grained logic elements including coarse grained logic element programmable pins; and
    a carrier board for electrically interconnecting said at least one fine grained logic element and said at least one coarse grained logic element by forming vias between said fine grained logic element programmable pins and said coarse grained logic element programmable pins so as to maximize bandwidth between said at least one fine grained logic element and said coarse grained logic element.

4. The reconfigurable processor element of claim 3 wherein said at least one fine grained logic element comprises an FPGA.

5. The reconfigurable processor element of claim 3 wherein said at least one coarse grained logic element comprises an ASIC.

6. The reconfigurable processor element of claim 3 wherein said at least one fine grained logic element comprises elements which are reconfigurable and said coarse grained logic element comprises elements which are non-reconfigurable.

7. The reconfigurable processor element of claim 3 wherein said at least one coarse grained logic element is configured to provided substantially dedicated high level mathematical functions.

8. The reconfigurable processor element of claim 7 wherein said high level mathematical functions comprise floating point operations.

9. The reconfigurable processor element of claim 3 wherein said at least one coarse grained logic element is configured to provided substantially dedicated high level I/O functions.

10. The reconfigurable processor element of claim 9 wherein said high level I/O functions comprise Ethernet connectivity.

11. The reconfigurable processor element of claim 9 wherein said high level I/O functions comprise disk drive connectivity.

12. The reconfigurable processor element of claim 3 which is programmable utilizing a standard high level programming language.

13. The reconfigurable processor element of claim 3 which utilizes data streaming for data movement between said at least one fine grained logic element and said at least one coarse grained element.

14. The reconfigurable processor element of claim 3 which utilizes data streaming for data movement between said reconfigurable processor element and other elements of a computer system comprising said reconfigurable processor element.

15. The reconfigurable processor element of claim 3 wherein said at least one fine grained logic element and said at least one coarse grained logic clement are coupled to opposite sides of a carrier board.

16. A carrier board for a reconfigurable processor element comprising:
    a first side for mounting a first logic element having a first device pinout wherein said first logic element comprises at least one fine grained logic element and wherein said first device pinout is reconfigurable; and
    a second opposite side for mounting a second logic element having a differing second device reconfigurable pinout wherein said second logic element comprises at least one coarse grained logic element and wherein at least one of said first device pinout and at least one of said second device pinout is reconfigured to optimize bandwidth between said first logic element and said second logic element.

17. The carrier board of claim 16 wherein said second device pinout is reconfigurable.

18. The carrier board of claim 16 wherein said first logic element comprises an FPGA.

19. The carrier board of claim 16 wherein said second logic element comprises an ASIC.

* * * * *